US012340840B2

(12) United States Patent
Kim et al.

(10) Patent No.: US 12,340,840 B2
(45) Date of Patent: Jun. 24, 2025

(54) NONLINEARITY COMPENSATION CIRCUIT FOR MEMRISTIVE DEVICE

(71) Applicant: KOREA INSTITUTE OF SCIENCE AND TECHNOLOGY, Seoul (KR)

(72) Inventors: Jaewook Kim, Seoul (KR); Kyu Sik Mun, Seoul (KR); Yeonjoo Jeong, Seoul (KR); Joon Young Kwak, Seoul (KR); Jongkil Park, Seoul (KR); Suyoun Lee, Seoul (KR); Jong-Keuk Park, Seoul (KR); Inho Kim, Seoul (KR); Seongsik Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 343 days.

(21) Appl. No.: 17/966,305

(22) Filed: Oct. 14, 2022

(65) Prior Publication Data
US 2023/0170017 A1    Jun. 1, 2023

(30) Foreign Application Priority Data
Nov. 30, 2021 (KR) .................. 10-2021-0168412

(51) Int. Cl.
G11C 13/00        (2006.01)
(52) U.S. Cl.
CPC ...... G11C 13/0038 (2013.01); G11C 13/0061 (2013.01)
(58) Field of Classification Search
CPC ................................................ G11C 13/0007
See application file for complete search history.

(56) References Cited

U.S. PATENT DOCUMENTS

| 9,189,730 B1 | 11/2015 | Coenen et al. |
| 10,964,369 B2 | 3/2021 | Shibata |
| 2012/0096234 A1 | 4/2012 | Jiang et al. |
| 2016/0284408 A1* | 9/2016 | Chiou ............... G11C 13/0007 |
| 2019/0189174 A1 | 6/2019 | Hu et al. |
| 2020/0327401 A1 | 10/2020 | Bates et al. |
| 2021/0257405 A1 | 8/2021 | Lesso |

FOREIGN PATENT DOCUMENTS

| EP | 3 955 458 A1 | 2/2022 |
| KR | 10-1489416 B1 | 2/2015 |
| KR | 10-1988112 B1 | 6/2019 |

(Continued)

OTHER PUBLICATIONS

Adhikari, Shyam Prasad, et al. "Memristor bridge synapse-based neural network and its learning." *IEEE Transactions on neural networks and learning systems* vol. 23. Issue 9 (2012). pp. 1426-1435.

(Continued)

*Primary Examiner* — Jason Lappas
(74) *Attorney, Agent, or Firm* — NSIP Law

(57) ABSTRACT

The present disclosure relates to a nonlinearity compensation circuit for a memristive device. The circuit according to an embodiment includes at least one power source unit to apply an input pulse; a modulation unit connected to the at least one power source unit to adjust a pulse width of an update pulse to be applied to the memristive device; and the memristive device to which the modulated update pulse is applied.

6 Claims, 9 Drawing Sheets

(56) References Cited

FOREIGN PATENT DOCUMENTS

| | | |
|---|---|---|
| KR | 10-2021-0063721 A | 6/2021 |
| KR | 10-2021-0103331 A | 8/2021 |
| KR | 10-2021-0120440 A | 10/2021 |
| KR | 10-2021-0145819 A | 12/2021 |
| WO | WO 2009/113993 A1 | 9/2009 |

OTHER PUBLICATIONS

Wang, I-Ting, et al. "3D Ta/TaOx/TiIO2/Ti synaptic array and linearity tuning of weight update for hardware neural network applications." *Nanotechnology* vol. 27. Issue 36 (2016): 365204. pp. 1-9.

Panwar, Neeraj, et al. "Arbitrary spike time dependent plasticity (STDP) in memristor by analog waveform engineering." *IEEE Electron Device Letters* vol. 38. Issue 6 (2017). pp. 740-743.

\* cited by examiner

NONLINEARITY COMPENSATION CIRCUIT FOR MEMRISTIVE DEVICE

DESCRIPTION OF GOVERNMENT-FUNDED RESEARCH AND DEVELOPMENT

This research is conducted under the support of innovative growth linked intelligent semiconductor leading technology development (R&D), [Sub-pJ spiking artificial neural network technology, Project Serial No.: 1711128542, Project Docket No.: 2019M3F3A1A02072175] of Ministry of Science and ICT.

This research is conducted under the support of next generation intelligent semiconductor technology development (R&D), [cerebellum model based autonomous mobile robot correction learning algorithm and non von Neumann architecture CMOS chip development, Project Serial No.: 1711134774, Project Docket No.: 2021M3F3A2A01037809] of Ministry of Science and ICT.

CROSS-REFERENCE TO RELATED APPLICATION

This application claims priority to Korean Patent Application No. 10-2021-0168412, filed on Nov. 30, 2021, and all the benefits accruing therefrom under 35 U.S.C. § 119, the contents of which in its entirety are herein incorporated by reference.

BACKGROUND

1. Field

The present disclosure relates to a circuit for compensating for nonlinearity in a memristive device.

2. Description of the Related Art

A memristor is a word blending of memory and resistor, and performs combined functions of memory and process. Specifically, the memristive device is a special memory device that can change the resistance depending on the amount of electric charge applied, and remembers the previous resistance state even when the power is off.

That is, the memristive device performs a nonvolatile memory function to store various information and an analog multiplier function for weighted computation, and thus is a suitable device for implementation of synapses.

However, to precisely control the synaptic weight from the memristive device, the memristive device requires low conductance, a long retention time, a high ON/OFF resistance change ratio and linearity of conductance modulation.

However, in general, the memristive device has a property that modulation G of conductance is nonlinearly programmed over time. Referring to FIG. 1, when the memristive device is updated through an update pulse $V_M$) with the constant pulse width $PW_P$ for potentiation and the constant pulse width $PW_D$ for depression, the variation $^\Delta G$ of conductance modulation in the common memristive device gradually decreases during updating.

To remove the nonlinearity in conductance modulation, many studies have been made at device level, but in practice, there are few results of studies addressing the nonlinearity in conductance modulation.

SUMMARY

The disclosed embodiments are directed to providing a circuit for compensating for nonlinearity in conductance modulation of a memristive device.

A nonlinearity compensation circuit for a memristive device according to an embodiment includes at least one power source unit to apply an input pulse; a modulation unit connected to the at least one power source unit to modulate a pulse width of an update pulse applied to the memristive device through the input pulse; and the memristive device to which the modulated update pulse is applied.

The modulation unit may include a plurality of first transistors, a plurality of second transistors and a first capacitor.

When a conductance of the memristive device includes convex nonlinearity characteristics, the modulation unit may modulate the pulse width in inverse proportion to the conductance based on a threshold voltage of the first capacitor.

The first capacitor may be charged by a current generated in proportion to the conductance using the plurality of first transistors.

When a conductance of the memristive device includes concave nonlinearity characteristics, the modulation unit may modulate the pulse width in proportion to the conductance based on a threshold voltage of the first capacitor.

The first capacitor may be charged by a current generated in inverse proportion to the conductance using the plurality of first transistors.

The modulation unit may turn off the update pulse based on the plurality of second transistors.

The disclosed embodiments can remove nonlinearity in conductance modulation of a memristive device by tuning the pulse width applied to the memristive device.

DETAILED DESCRIPTION

Figure 1:
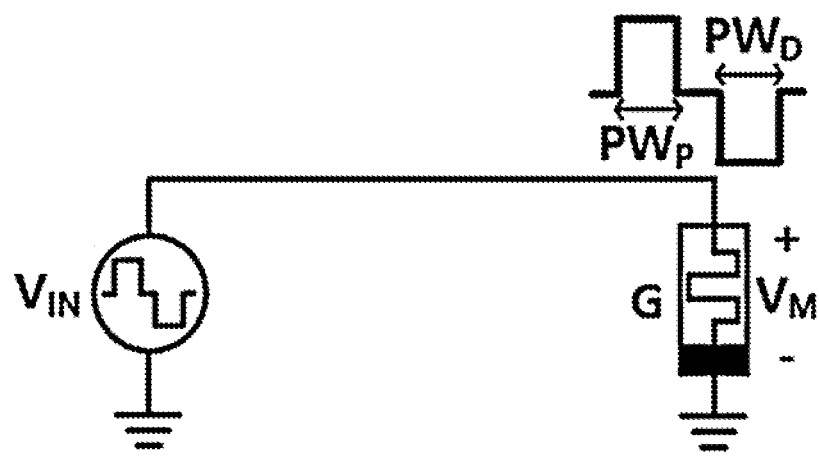
FIG. 1 is a diagram illustrating nonlinearity in conductance modulation which is the common property of a memristive device.
Figure 1:
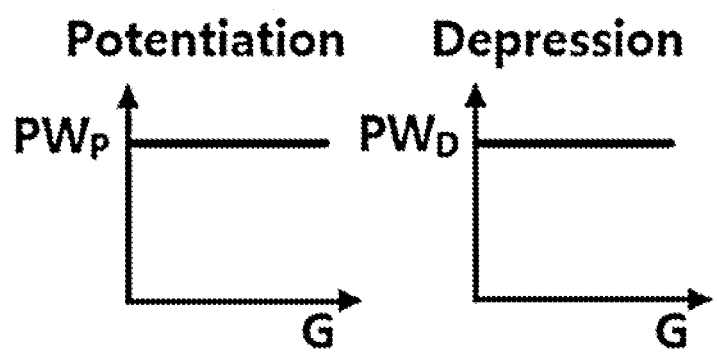
Figure 1:
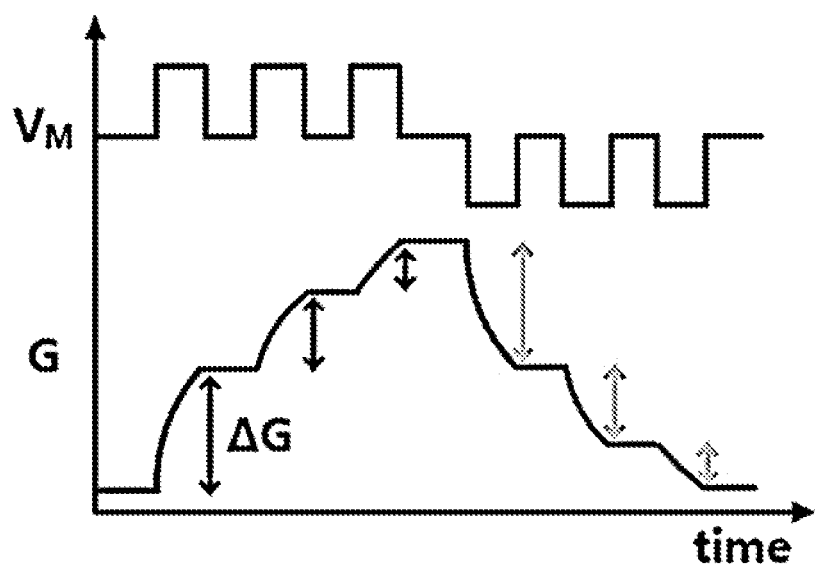

The following detailed description of the present disclosure is made with reference to the accompanying drawings, in which particular embodiments for practicing the present disclosure are shown for illustrative purposes. These embodiments are described in sufficiently detail for those skilled in the art to practice the present disclosure. It should be understood that various embodiments of the present disclosure are different but do not need to be mutually exclusive. For example, particular shapes, structures and features described herein in connection with one embodiment may be embodied in other embodiment without departing from the spirit and scope of the present disclosure. It should be further understood that changes may be made to the positions or placement of individual elements in each disclosed embodiment without departing from the spirit and scope of the present disclosure. Accordingly, the following detailed description is not intended to be taken in limiting senses, and the scope of the present disclosure, if appropriately described, is only defined by the appended claims along with the full scope of equivalents to which such claims are entitled. In the drawings, similar reference signs denote same or similar functions in many aspects.

The terms as used herein are general terms selected as those being now used as widely as possible in consideration of functions, but they may differ depending on the intention of those skilled in the art or the convention or the emergence of new technology. Additionally, in certain cases, there may be terms arbitrarily selected by the applicant, and in this case, the meaning will be described in the corresponding description part of the specification. Accordingly, it should be noted that the terms as used herein should be interpreted based on the substantial meaning of the terms and the context throughout the specification, rather than simply the name of the terms.

Hereinafter, the exemplary embodiments of the present disclosure will be described in detail with reference to the accompanying drawings and the context described in the accompanying drawings.

Figure 2:
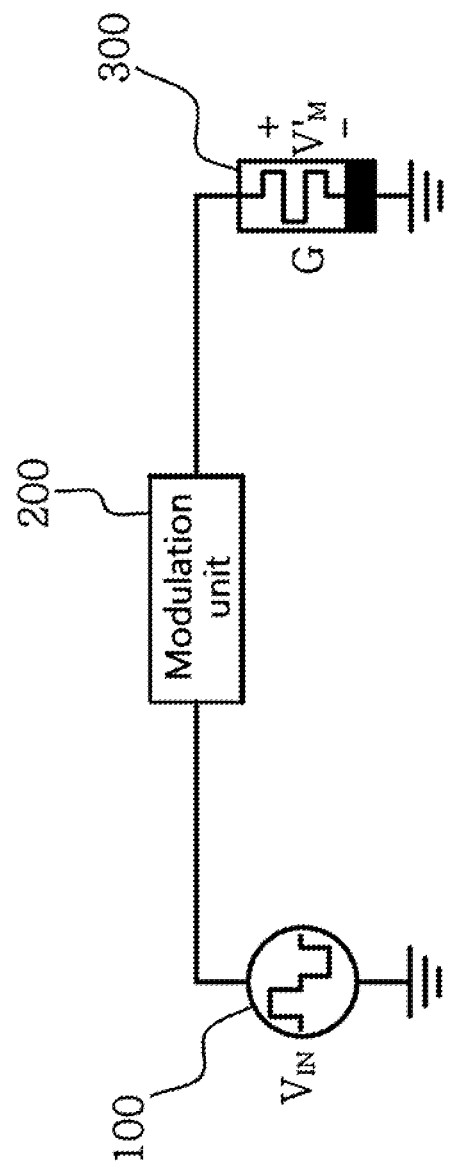
FIG. 2 is a schematic equivalent circuit diagram of a nonlinearity compensation circuit for a memristive device according to an embodiment.

FIG. 2 is a schematic equivalent circuit diagram of a nonlinearity compensation circuit for a memristive device 300 according to an embodiment.

Referring to FIG. 2, the nonlinearity compensation circuit for the memristive device 300 includes a power source unit 100, a modulation unit 200 and the memristive device 300.

The power source unit 100 applies an input pulse. The power source unit 100 may be singular or plural without limitations on the number. For example, the plurality of power source units 100 may include a first power source unit 100 to apply an input pulse for potentiation and a second power source unit 100 to apply an input pulse for depression.

The modulation unit 200 is connected to at least one power source unit 100 to modulate the pulse width of an update pulse to be applied to the memristive device 300.

According to an embodiment, the modulation unit 200 may include a plurality of first transistors, a plurality of second transistors and a first capacitor, and may modulate the pulse width of the update pulse using the plurality of first transistors, the plurality of second transistors and the first capacitor.

According to an embodiment, the modulation unit 200 may turn off the update pulse after the threshold time based on the plurality of second transistors.

According to an embodiment, the modulation unit 200 may interrupt the input pulse and remove the update pulse after the threshold time using the plurality of second transistors.

In this instance, the threshold time may refer to the time at which the voltage of the first capacitor reached the threshold voltage.

The memristive device 300 receives the modulated update pulse.

According to an embodiment, the memristive device 300 may receive the amplified update pulse more than the magnitude of the input pulse or the update pulse of the equal magnitude to the input pulse through at least one transistor.

Although it is described that the nonlinearity compensation circuit for the memristive device 300 includes the plurality of transistors and the single capacitor, this is provided for illustrative purposes, and other components than the above-described components, such as an inverter, a current source, etc., may be further included.

FIGS. 3A to 3H is a graph showing modulation aspects for each nonlinearity type and each type of the modulation unit 200.

Referring to FIGS. 3A to 3D, the nonlinearity in conductance modulation of the memristive device 300 may include four types.

Figure 3A:
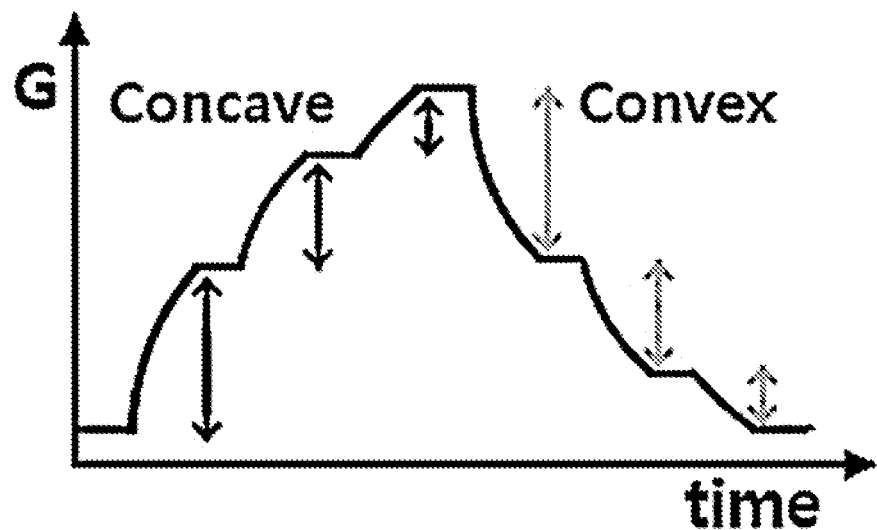
FIGS. 3A to 3H is a graph showing modulation aspects for each nonlinearity type and each type of modulation unit.

For example, referring to FIG. 3A, a first type of nonlinearity in conductance modulation may include nonlinearity characteristics that are concave for potentiation and convex for depression.

Here, the concave nonlinearity is represented by $G''(t)>0$. The convex nonlinearity is represented by $G''(t)<0$. In this instance, $G(t)$ is the conductance of the memristive device 300 over time.

Figure 3B:
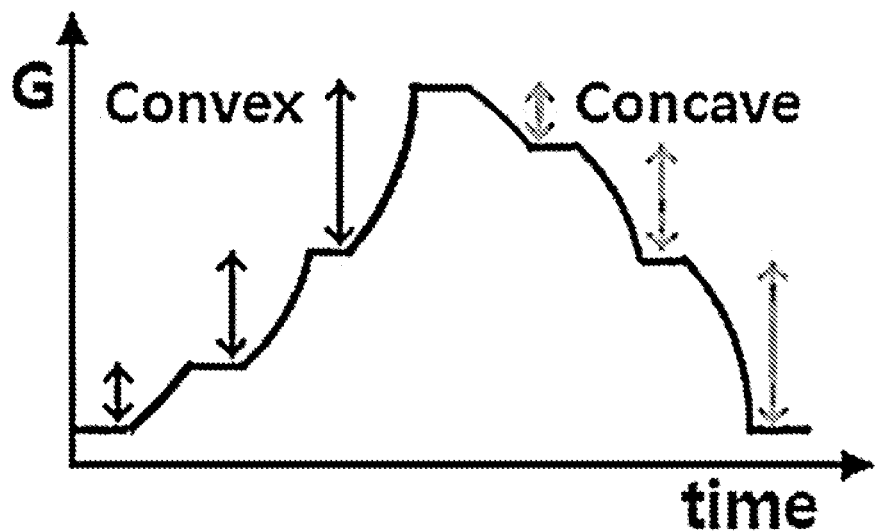

In another example, referring to FIG. 3B, a second type of nonlinearity in conductance modulation may include nonlinearity characteristics that are convex for potentiation and concave for depression.

Figure 3C:
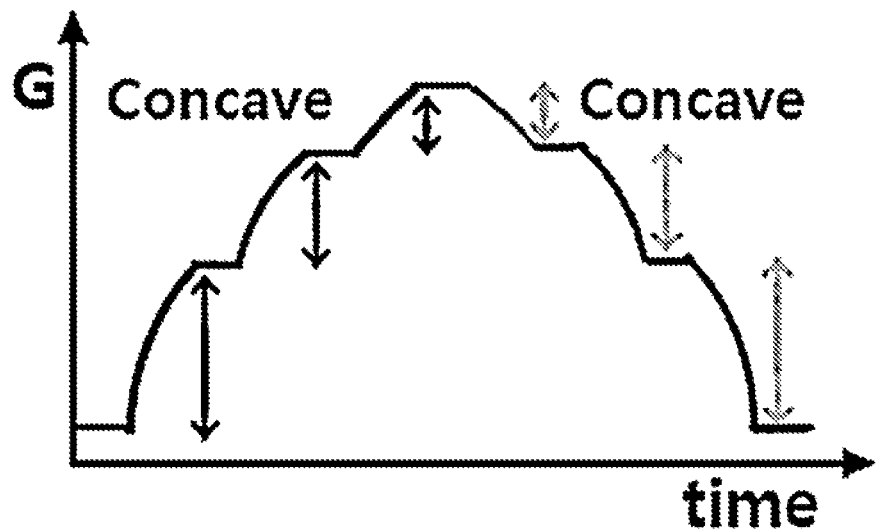

In another example, referring to FIG. 3C, a third type of nonlinearity in conductance modulation may include nonlinearity characteristics that are concave for potentiation and concave for depression.

Figure 3D:
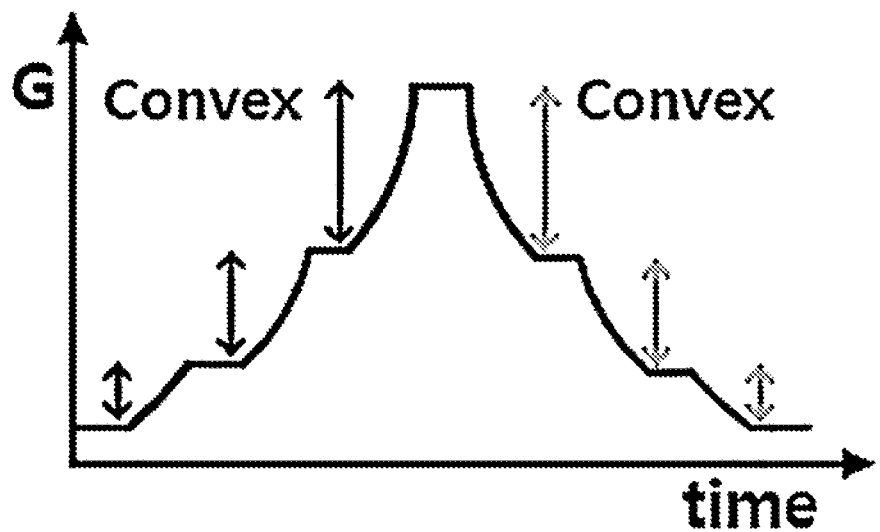

In another example, referring to FIG. 3D, a fourth type of nonlinearity in conductance modulation may include nonlinearity characteristics that are convex for potentiation and convex for depression.

Referring to FIGS. 3E to 3H, the modulation unit 200 modulates the update pulse width in different aspects for each nonlinearity type.

For convenience of description, the modulated update pulse applied to the memristive device 300 is referred to as $V'_M$, the pulse width of the update pulse modulated for potentiation is referred to as a first pulse width $PW'_P$), and the pulse width of the update pulse modulated for depression is referred to as a second pulse width $PW'_D$.

Figure 3E:
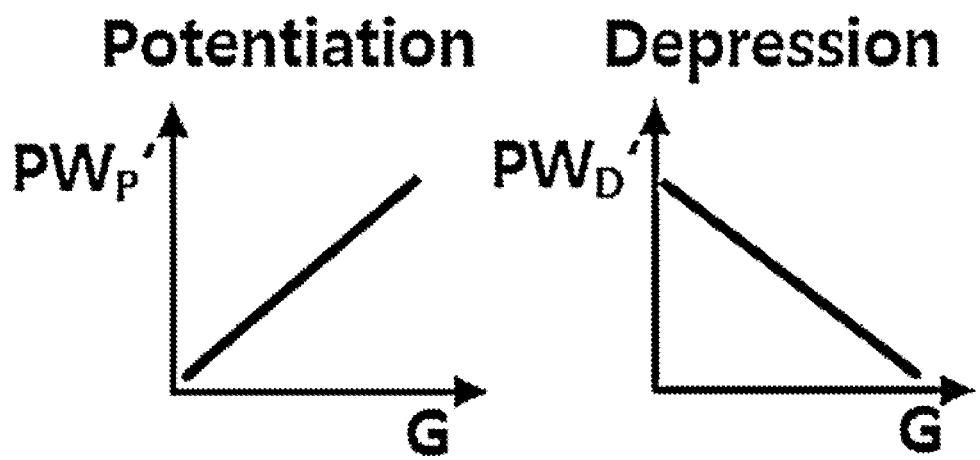

Referring to FIG. 3E, in regard to the first type, the modulation unit 200 may modulate the first pulse width in proportion to the conductance and the second pulse width in inverse proportion to the conductance.

Figure 3F:
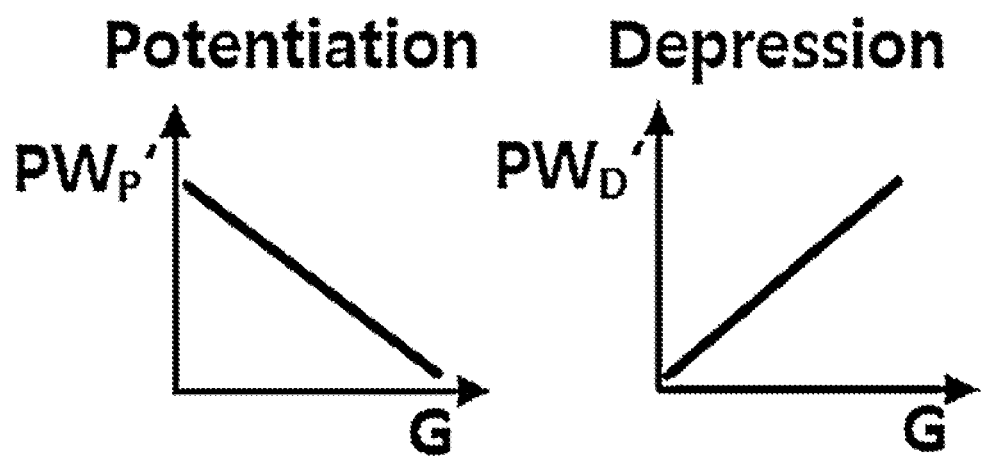

Referring to FIG. 3F, in regard to the second type, the modulation unit 200 may modulate the first pulse width in inverse proportion to the conductance and the second pulse width in proportion to the conductance.

Figure 3G:
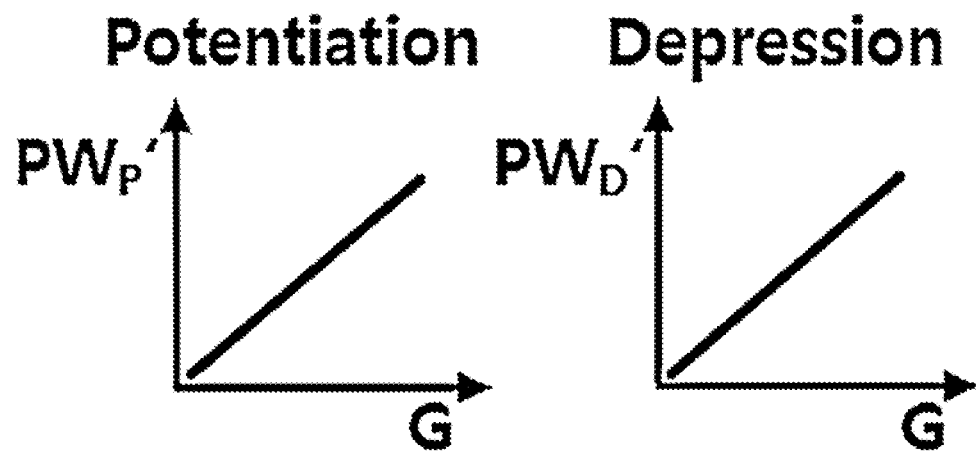

Referring to FIG. 3G, in regard to the third type, the modulation unit 200 may modulate the first pulse width in proportion to the conductance and the second pulse width in proportion to the conductance.

Figure 3H:
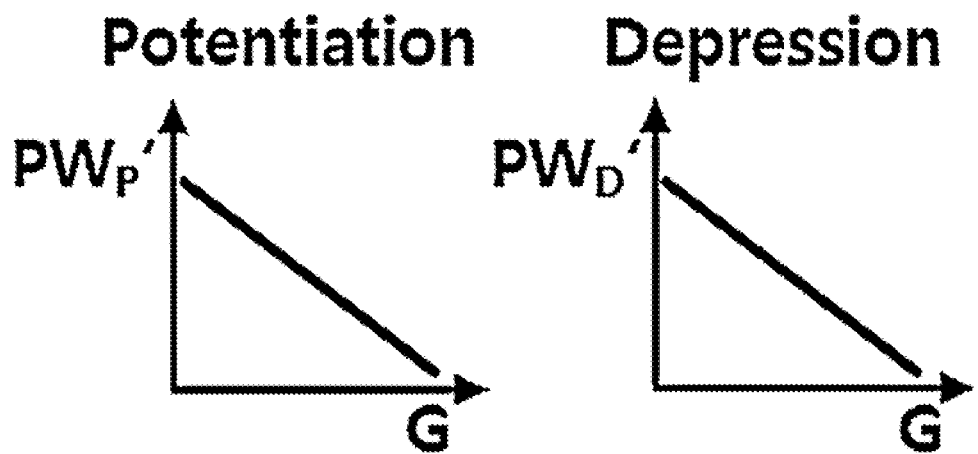

Referring to FIG. 3H, in regard to the fourth type, the modulation unit 200 may modulate the first pulse width in inverse proportion to the conductance and the second pulse width in inverse proportion to the conductance.

Through this, the nonlinearity compensation circuit for the memristive device 300 according to an embodiment may improve the nonlinearity in conductance modulation of the memristive device 300 for all the types.

Figure 4:
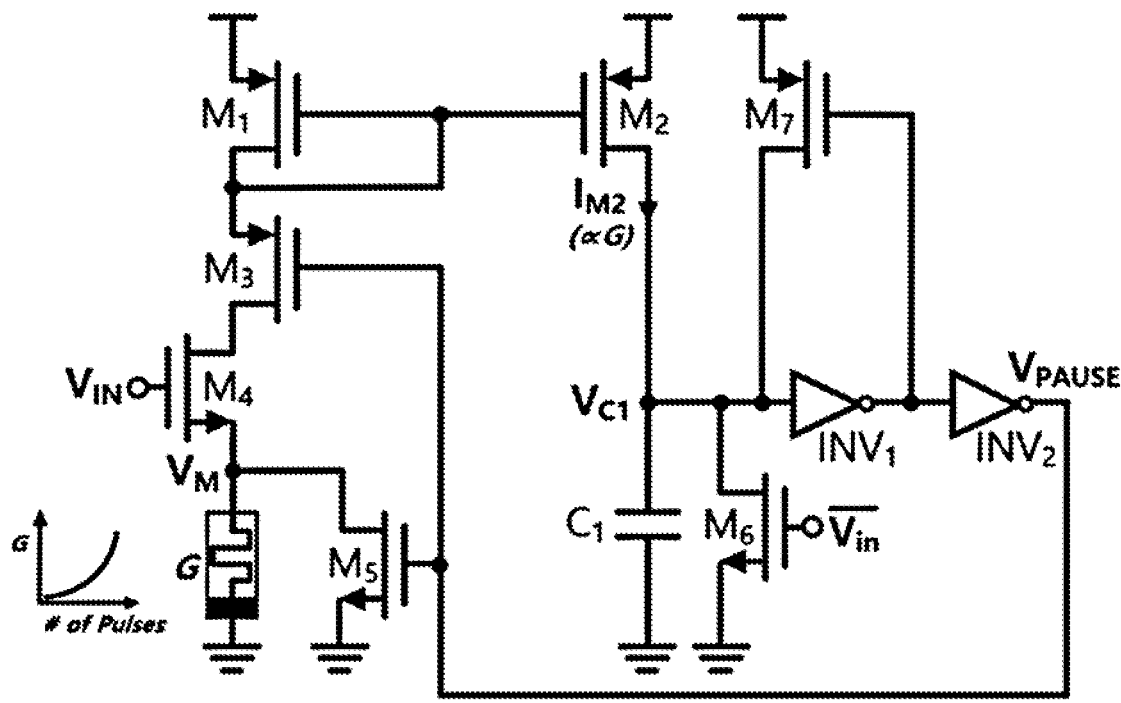
FIG. 4 is a first circuit diagram and an operation waveform diagram illustrating a modulation unit according to an embodiment.
Figure 4:
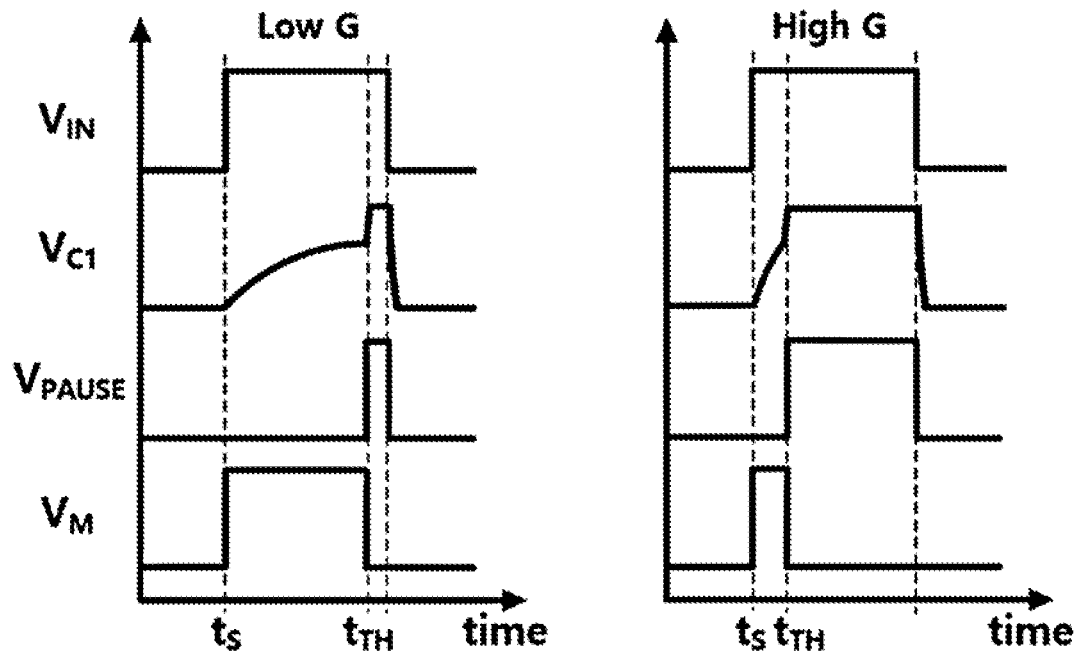

FIG. 4 shows a first circuit diagram and an operation waveform diagram illustrating the modulation unit 200 according to an embodiment.

Referring to FIG. 4, for the memristive device 300 having convex nonlinearity characteristics, the modulation unit 200 may modulate the update pulse width in inverse proportion to the conductance.

In other words, according to an embodiment, the modulation unit 200 may modulate to increase the pulse width of the update pulse according to low conductance of the memristive device 300, and decrease the pulse width of the update pulse according to high conductance of the memristive device 300.

Specifically, according to an embodiment, the modulation unit 200 may modulate the pulse width of the update pulse applied to the memristive device 300 in inverse proportion to the conductance based on the threshold voltage of the first capacitor.

For convenience of description, $V_{IN}$ of the first circuit is defined as the input pulse applied by the power source unit 100, $V_{C1}$ is defined as the first capacitor voltage, $V_{PAUSE}$ is defined as update pause voltage, $t_s$ is defined as the start time at which the input pulse of the power source unit 100 is inputted to the modulation unit 200, and $t_{TH}$ is defined as the threshold time at which the first capacitor voltage reaches the threshold voltage.

First, when the power source unit 100 applies the input pulse to the modulation unit 200 at the start time, the modulation unit 200 may charge the first capacitor from the current $I_{M2}$ flowing in the first capacitor.

In this instance, the current flowing in the first capacitor may be a current generated in proportion to the conductance using the plurality of first transistors. Specifically, the current flowing in the first capacitor may be a current generated by copying the current flowing in the memristive device based on some of the plurality of first transistors.

Subsequently, when the threshold time is reached as the voltage of the first capacitor reaches the threshold value, the modulation unit 200 may pause the updates of the memristive device 300 by generating the pulse of the update pause voltage and removing the update pulse.

That is, according to an embodiment, the modulation unit 200 may modulate the pulse width of the update pulse with a length from the start time to the threshold time.

Eventually, according to an embodiment, the modulation unit 200 may modulate the update pulse width in inverse proportion to the conductance by allowing the current that is proportional to the conductance to flow in the first capacitor using the plurality of first transistors.

Although it is described that the first circuit diagram is a circuit showing the modulation unit 200, this is provided for illustrative purses, and the modulation unit 200 is not necessarily limited to the first circuit and may include any circuit configured to modulate the update pulse width based on the threshold voltage.

Figure 5:
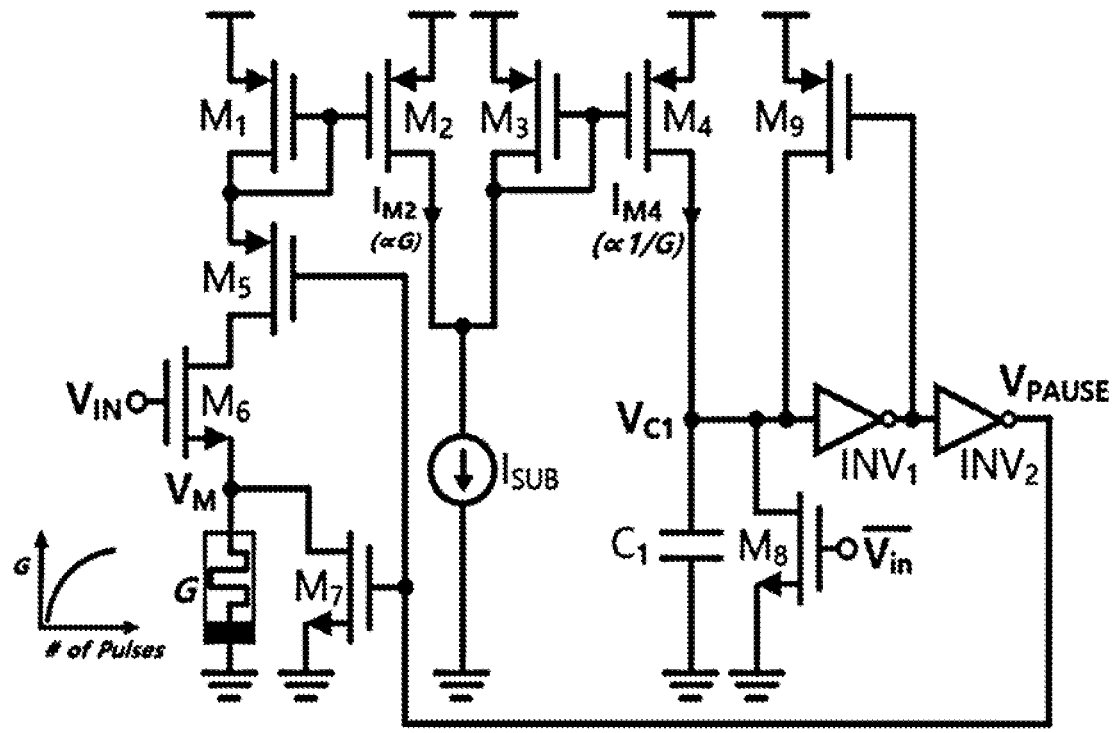
FIG. 5 is a second circuit diagram and an operation waveform diagram illustrating a modulation unit according to an embodiment.
Figure 5:
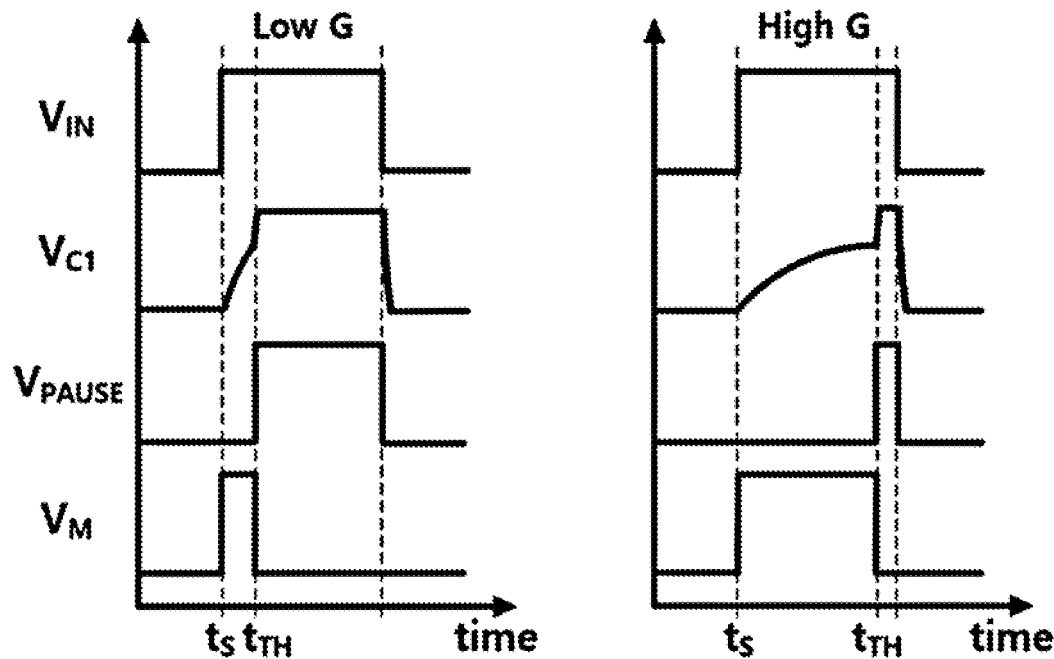

FIG. 5 is a second circuit diagram and an operation waveform diagram illustrating the modulation unit 200 according to an embodiment.

Referring to FIG. 5, for the memristive device 300 having concave nonlinearity characteristics, the modulation unit 200 may modulate the update pulse width in proportion to the conductance of the memristive device 300.

In other words, according to an embodiment, the modulation unit 200 may modulate to decrease the pulse width of the update pulse according to low conductance of the memristive device 300, and increase the pulse width of the update pulse according to high conductance of the memristive device 300.

Specifically, according to an embodiment, the modulation unit 200 may modulate the pulse width of the update pulse applied to the memristive device 300 in proportion to the conductance based on the threshold voltage of the first capacitor.

For convenience of description, as shown in FIGS. 3A to 3H, $V_{IN}$ of the second circuit is defined as the input pulse applied by the power source unit 100, $V_{C1}$ is defined as the first capacitor voltage, $V_{PAUSE}$ is defined as the update pause voltage, $t_s$ is defined as the start time at which the input pulse of the power source unit 100 is inputted to the modulation unit 200, and $t_{TH}$ is defined as the threshold time at which the first capacitor voltage reaches the threshold voltage.

First, when the power source unit 100 applies the input pulse to the modulation unit 200 at the start time, the modulation unit 200 may charge the first capacitor from the current $I_{M4}$ flowing in the first capacitor.

In this instance, the current $I_{M4}$ flowing in the first capacitor may be a current generated in inverse proportion to the conductance using the plurality of first transistors and the current source.

Specifically, the current flowing in the first capacitor may be a current resulting from subtracting a constant current $I_{SUB}$ from the current generated by copying the current flowing in the memristive device based on some of the plurality of first transistors.

Subsequently, when the threshold time is reached as the voltage of the first capacitor reaches the threshold value, the modulation unit 200 may pause the updates of the memristive device 300 by generating the pulse of the update pause voltage and removing the update pulse.

That is, according to an embodiment, the modulation unit 200 may modulate the pulse width of the update pulse with a length from the start time to the threshold time.

Eventually, according to an embodiment, the modulation unit 200 may modulate the pulse width of the update pulse in proportion to the conductance by allowing the current that is inversely proportional to the conductance to flow in the first capacitor using the plurality of first transistors.

Although it is described that the second circuit diagram is a circuit showing the modulation unit 200, this is provided for illustrative purposes, and the modulation unit 200 is not necessarily limited to the second circuit and may include any circuit configured to modulate the update pulse width based on the threshold voltage.

Figure 6:
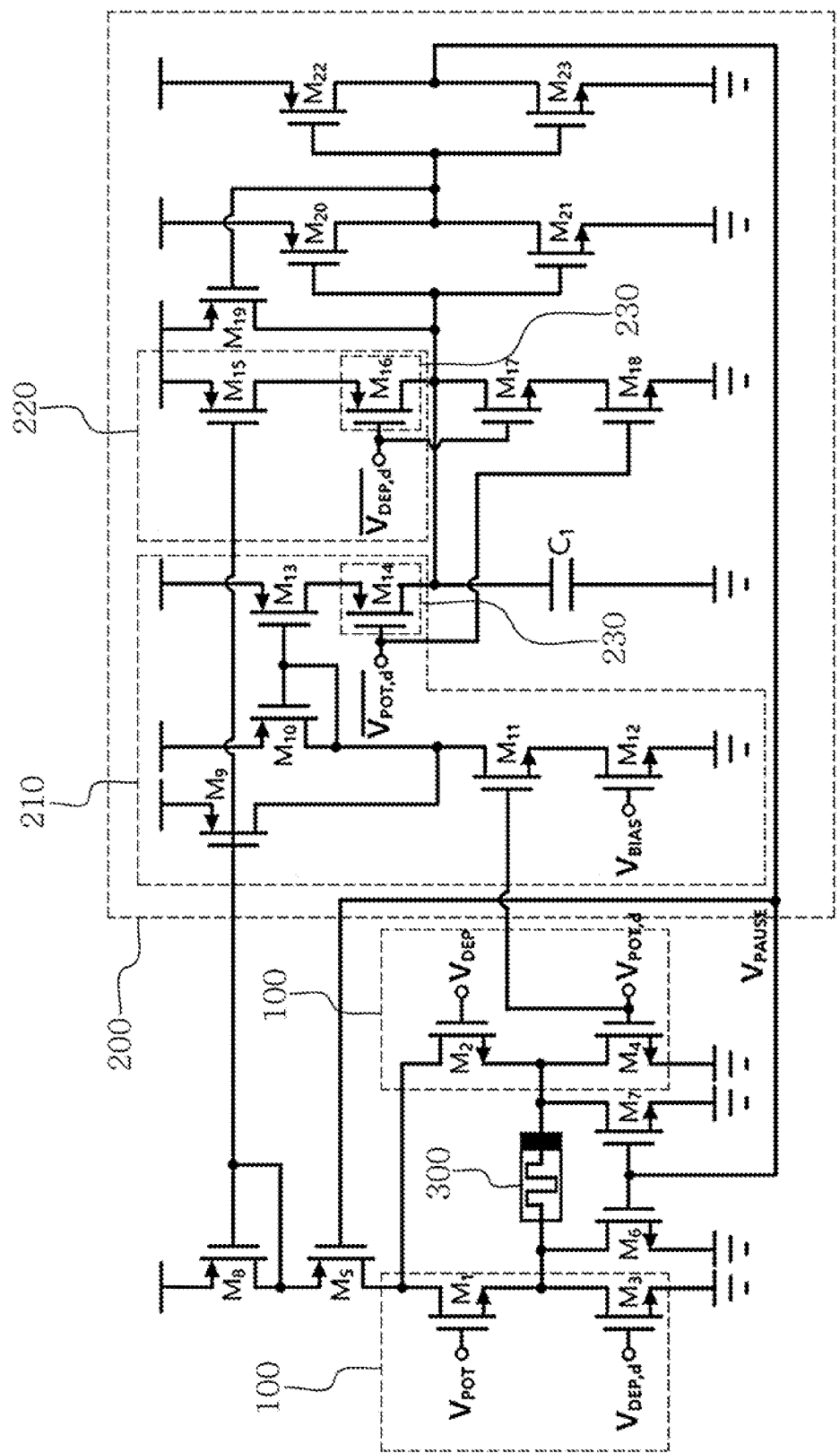
FIG. 6 is a third circuit diagram illustrating a modulation unit according to an embodiment.

FIG. 6 is a third circuit diagram illustrating the modulation unit 200 according to an embodiment.

Referring to FIG. 6, the nonlinearity compensation circuit for the memristive device 300 according to an embodiment includes the plurality of power source units 100, the modulation unit 200 and the memristive device 300.

The nonlinearity compensation circuit for the memristive device 300 according to an embodiment includes the power source unit 100 including the first power source unit 100 $V_{POT}$ and the second power source unit 100 $V_{DEP}$.

In this instance, the first power source unit 100 may apply an input pulse for potentiation.

In this instance, the second power source unit 100 may apply an input pulse for depression.

According to an embodiment, the modulation unit 200 may include a first sector 210, a second sector 220 and a switching unit 230.

According to an embodiment, the modulation unit 200 may modulate the pulse width of the update pulse in proportion to the conductance to remove the concave nonlinearity characteristics in conductance modulation through the first sector 210.

According to an embodiment, the modulation unit 200 may modulate the pulse width of the update pulse in inverse proportion to the conductance to remove the convex nonlinearity characteristics in conductance modulation through the second sector 220.

According to an embodiment, the modulation unit 200 may selectively activate the first sector 210 and the second sector 220 through the switching unit 230 to modulate the pulse width of the update pulse in proportion to or in inverse proportion to the conductance.

For example, when the nonlinearity characteristics in conductance modulation are concave for potentiation and convex for depression, the modulation unit 200 may activate only the first sector 210 to modulate the first pulse width in proportion to the conductance for potentiation.

In this instance, the first pulse width may refer to the pulse width of the update pulse modulated for potentiation.

Specifically, according to an embodiment, the modulation unit 200 may charge the first capacitor through the current flowing in the first sector 210 for potentiation.

Subsequently, according to an embodiment, the modulation unit 200 may modulate the update pulse width in proportion to the conductance based on the threshold voltage of the first capacitor or the threshold voltage of the inverter with the plurality of transistors.

In contrast, according to an embodiment, in the same condition, the modulation unit 200 may activate only the second sector 220 to modulate the second pulse width in inverse proportion to the conductance for depression.

In this instance, the second pulse width may refer to the pulse width of the update pulse modulated for depression.

Specifically, according to an embodiment, the modulation unit 200 may charge the first capacitor through the current flowing in the second sector 220 for depression.

Subsequently, according to an embodiment, the modulation unit 200 may modulate the update pulse width in inverse proportion to the conductance based on the threshold voltage of the first capacitor or the threshold voltage of the inverter with the plurality of transistors.

According to an embodiment, when the input pulse is not applied from the power source unit 100 after the updates of the memristive device, the modulation unit 200 may initiate the memory of the memristive device by discharging the first capacitor using the plurality of second transistors.

Although it is described that the third circuit diagram is the nonlinearity compensation circuit for the memristive device 300, this is provided for illustrative purposes, and the nonlinearity compensation circuit for the memristive device 300 is not necessarily limited to the third circuit diagram.

While the present disclosure has been hereinabove described with reference to the embodiments, those skilled in the art will understand that a variety of modifications and changes may be made to the present disclosure without departing from the spirit and scope of the present disclosure set forth in the appended claims.

What is claimed is:

1. A nonlinearity compensation circuit for a memristive device, comprising:
   at least one power source unit to apply an input pulse;
   a modulation unit connected to the at least one power source unit to modulate a pulse width of an update pulse applied to the memristive device through the input pulse; and
   the memristive device to which the modulated update pulse is applied,
   wherein the modulation unit includes a plurality of first transistors, a plurality of second transistors and a first capacitor.

2. The nonlinearity compensation circuit for a memristive device according to claim 1, wherein when a conductance of the memristive device includes convex nonlinearity characteristics, the modulation unit modulates the pulse width in inverse proportion to the conductance based on a threshold voltage of the first capacitor.

3. The nonlinearity compensation circuit for a memristive device according to claim 2, wherein the first capacitor is charged by a current generated in proportion to the conductance using the plurality of first transistors.

4. The nonlinearity compensation circuit for a memristive device according to claim 1, wherein when a conductance of the memristive device includes concave nonlinearity characteristics, the modulation unit modulates the pulse width in proportion to the conductance based on a threshold voltage of the first capacitor.

5. The nonlinearity compensation circuit for a memristive device according to claim 4, wherein the first capacitor is charged by a current generated in inverse proportion to the conductance using the plurality of first transistors.

6. The nonlinearity compensation circuit for a memristive device according to claim 1, wherein the modulation unit turns off the update pulse based on the plurality of second transistors.

* * * * *